(12) United States Patent
Nakazawa

(10) Patent No.: US 9,748,731 B2
(45) Date of Patent: Aug. 29, 2017

(54) OPTICAL APPARATUS

(71) Applicant: Sumitomo Electric Device Innovations, Inc., Yokohama-shi (JP)

(72) Inventor: Keiji Nakazawa, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/669,895

(22) Filed: Mar. 26, 2015

(65) Prior Publication Data

US 2015/0280395 A1 Oct. 1, 2015

(30) Foreign Application Priority Data

Mar. 27, 2014 (JP) ................. 2014-065614

(51) Int. Cl.
*H01L 23/02* (2006.01)
*H01S 5/022* (2006.01)
*G02B 6/42* (2006.01)

(52) U.S. Cl.
CPC ............ *H01S 5/02216* (2013.01); *G02B 6/42* (2013.01); *H01S 5/02264* (2013.01); *H01S 5/02284* (2013.01)

(58) Field of Classification Search
CPC .......... H01L 2924/00; Y10T 29/49826; A63B 37/0063; A63B 37/0064; A63B 37/0076; A63B 37/0043; A63B 37/0045; A63B 37/0062; A63B 37/0066; A63B 37/0092; B82Y 40/00; B82Y 10/00
USPC ........................................... 257/678
See application file for complete search history.

(56) References Cited

U.S. PATENT DOCUMENTS

| 4,799,290 A * | 1/1989 | Lautenschlager, Jr. ................ E05D 7/0407 16/237 |
| 6,522,486 B2 * | 2/2003 | Furuhashi ............ G02B 6/4201 359/808 |
| 6,614,590 B2 * | 9/2003 | Tatoh ................... G02B 6/4201 359/344 |
| 6,917,482 B2 * | 7/2005 | Minamino ........... G02B 6/4201 359/811 |
| 6,963,593 B2 * | 11/2005 | Moriya ............... H01S 5/02216 372/36 |
| 7,365,979 B2 * | 4/2008 | Lee ........................... G06F 1/20 165/80.3 |
| 8,419,461 B2 * | 4/2013 | Song .................... H05K 7/1007 439/135 |

FOREIGN PATENT DOCUMENTS

JP 05-327031 12/1993

* cited by examiner

*Primary Examiner* — Xinning Niu
*Assistant Examiner* — Vu A Vu
(74) *Attorney, Agent, or Firm* — Venable LLP; Michael A. Sartori; Laura G. Remus

(57) ABSTRACT

An optical apparatus comprises a package containing an optical device and having a front end face provided with a through window part 11 to which an optical fiber optically connected to the optical device is attached, a base having an attachment surface for attaching the package, a first extension arranged so as to project from the front end face along the attachment surface, and a package securing member having a tilted surface adapted to abut against the package so as to generate a force for pressing the package against the base. The package securing member is independent of the package.

13 Claims, 11 Drawing Sheets

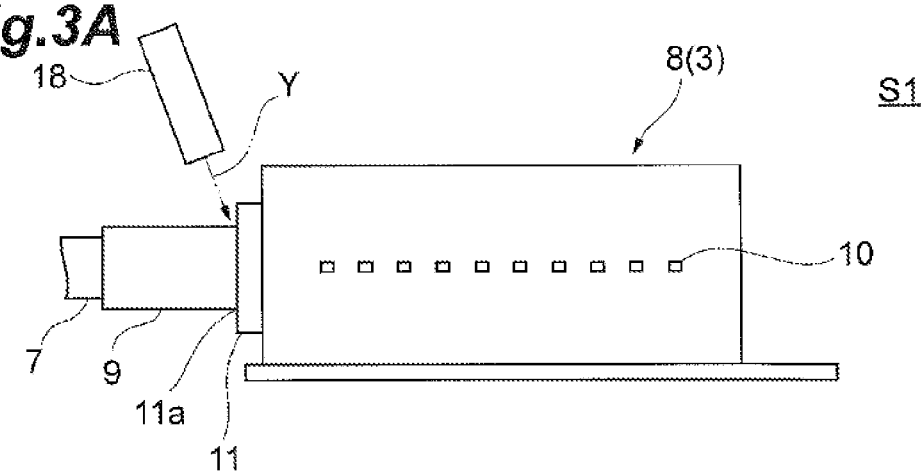
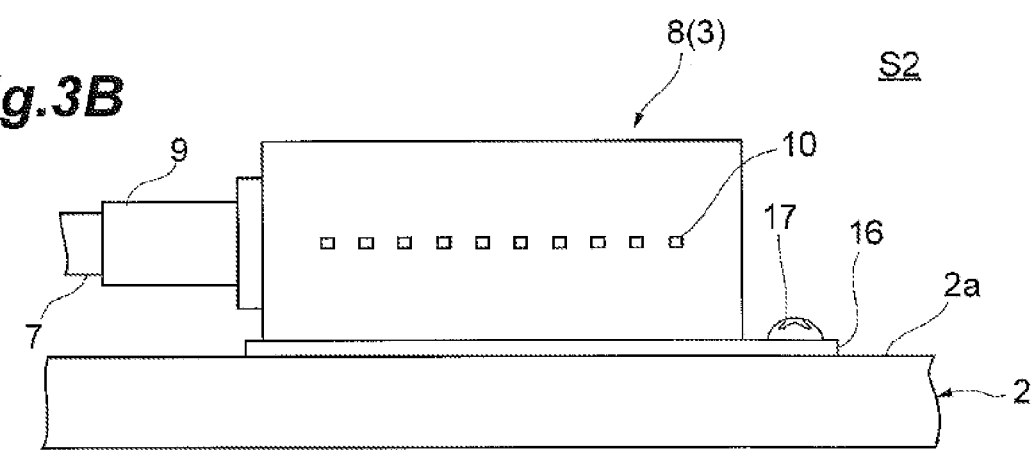
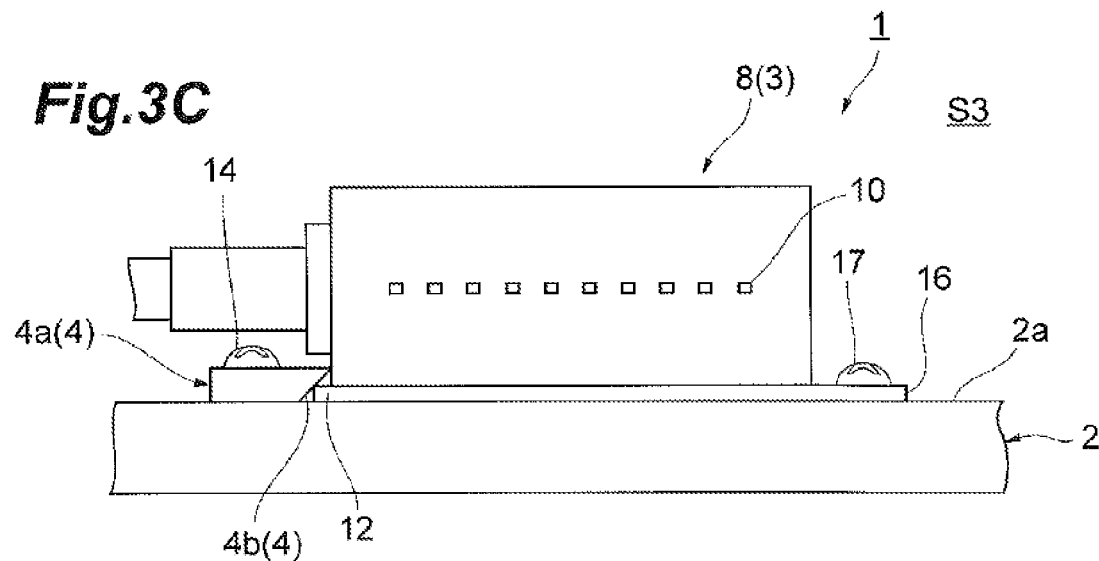

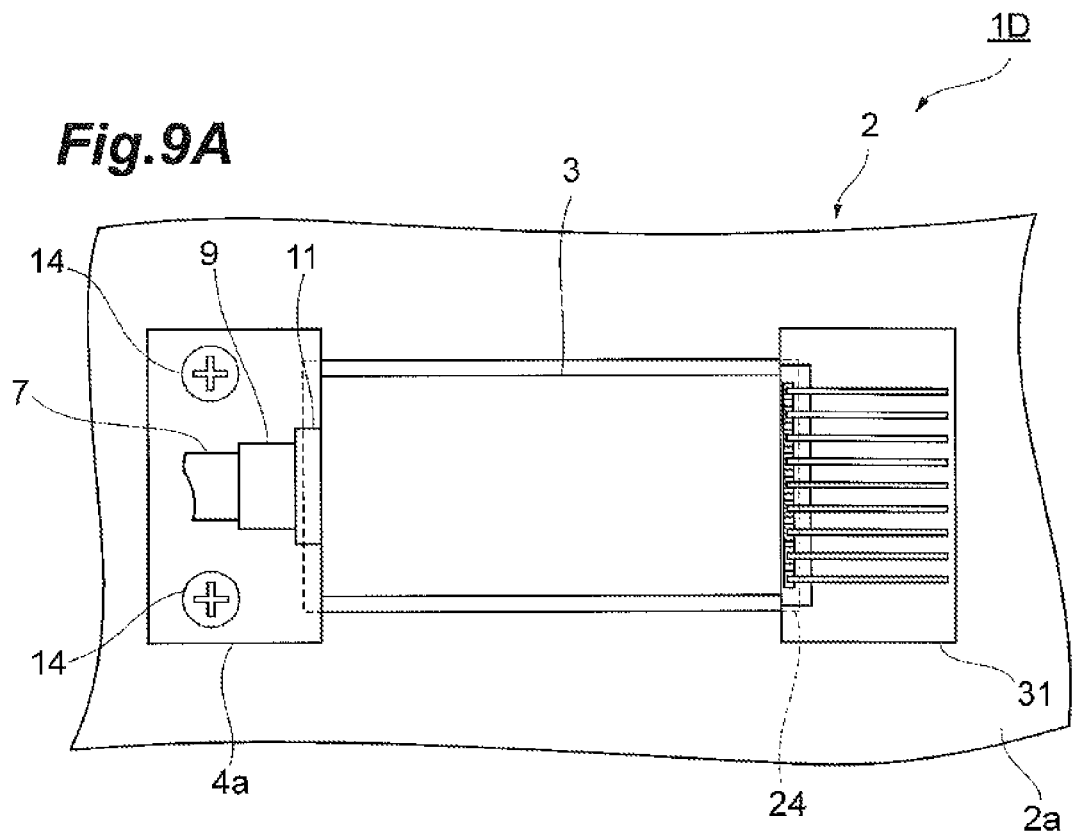
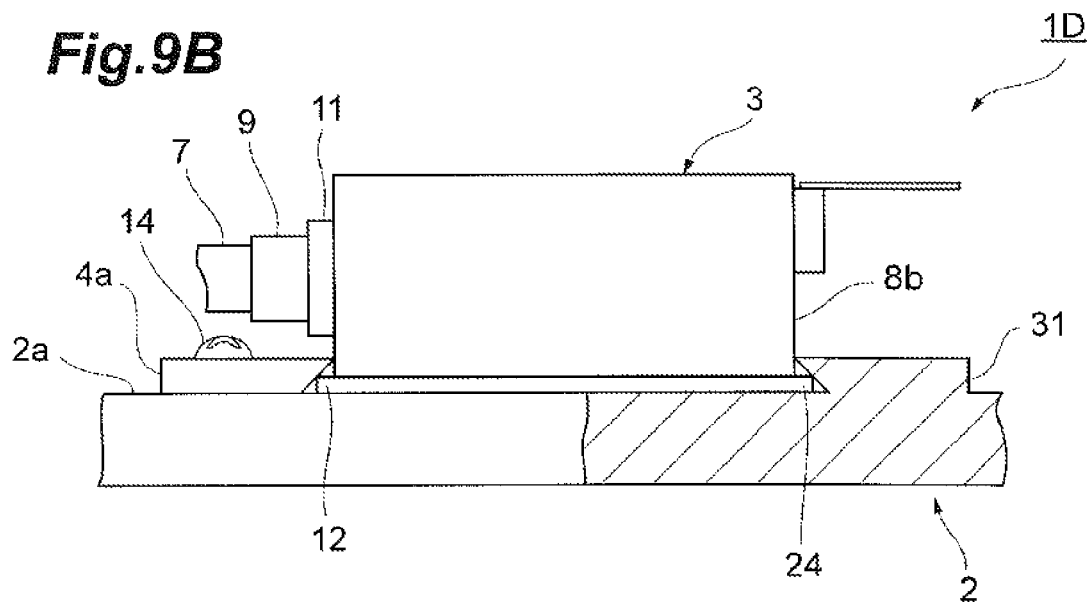

OPTICAL APPARATUS

BACKGROUND OF THE INVENTION

Technical Field

The present invention relates to an optical apparatus having a base to which a package containing an optical device is attached.

Background

Patent Literature 1 (Japanese Patent Application Laid-Open No. H05-327031) discloses an optical semiconductor module within which a semiconductor element is provided. The optical semiconductor module is equipped with a case body for containing a plurality of optical components such as laser diode elements. A pair of flanges are provided at both longitudinal ends of the case body. Through holes are formed in the flanges. The through holes are used for securing the optical semiconductor nodule to the base.

SUMMARY

Many of optical devices are contained in packages having flanges and screwed to bases by using through holes formed in the flanges. There are cases where the flanges are arranged at both longitudinal parts of a package as described in Patent Literature 1 in order to be kept from interfering with electrode leads provided in side parts of the package. However, flanges projecting from the package, if any, may lower workability in assembling optical devices.

The optical apparatus in accordance with one aspect of the present invention comprises package configured to contain a device, the package having a first side wall and an bottom wall; a base having an attachment surface to which the package is attached; a first extension constituted by a side of the bottom wall, the side projecting out of the first side wall; and a first package securing member having a pressing part, the pressing part abutting against the first extension so as to generate a force for pressing the package against the base, the package securing member being independent of the package.

BRIEF DESCRIPTION OF THE DRAWINGS

The foregoing and other purposes, aspects and advantages will be better understood from the following detailed description of a preferred embodiment of the invention with reference to the drawings, in which:

FIGS. 3A, 3B, and 3C are side views illustrating respective states of the steps illustrated in the flowchart of FIG. 2.

FIGS. 9A and 9B are diagrams illustrating an optical apparatus in accordance with Modified Example 2.

DETAILED DESCRIPTION

Figure 1A:
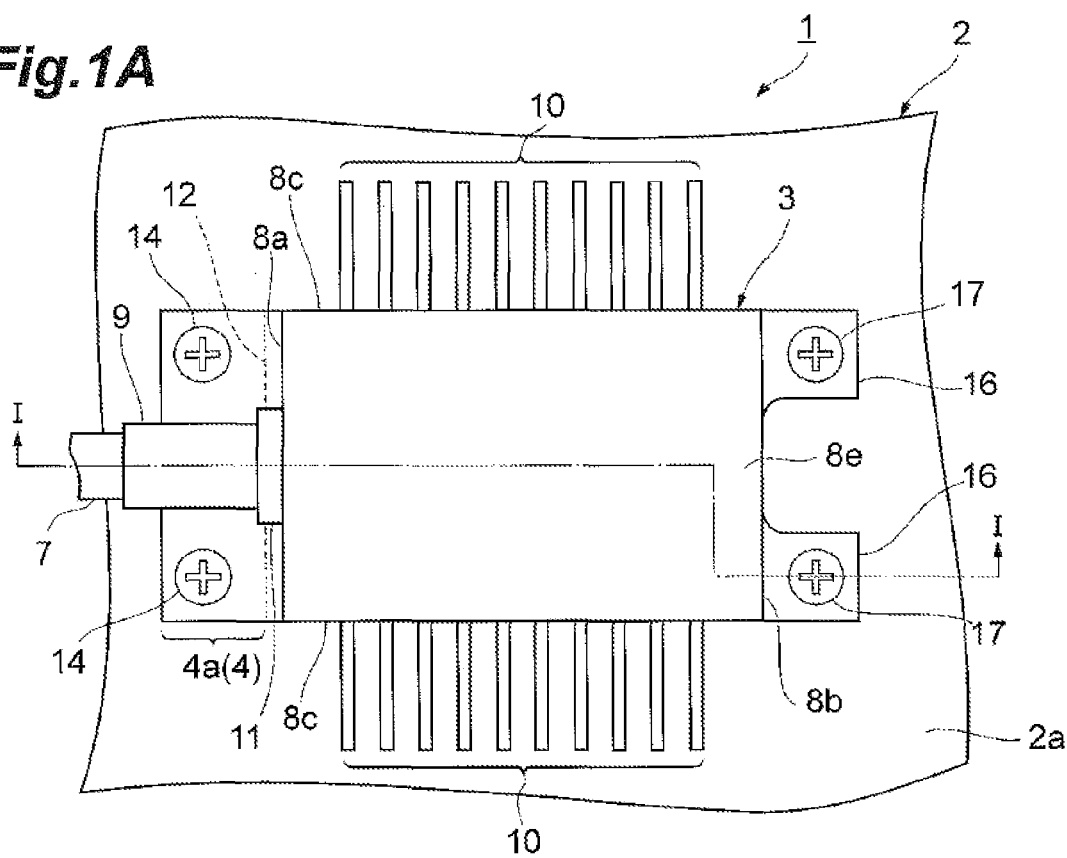
FIGS. 1A and 1B are diagrams illustrating an optical apparatus in accordance with a first embodiment.

Explanation of Embodiments of the Present Invention

First, embodiments of the present invention will be listed and explained.

The optical apparatus in accordance with one embodiment of the present invention comprises a package configured to enclose a device, the package having a first side wall and an bottom wall; a base having an attachment surface to which the bottom wall of the package is attached; a first extension forming a first side of the bottom wall, the first side extending from the first side wall of the package outwardly; and a first package securing member having a pressing part abutting against the first extension to press the package against the base; wherein the package securing member being independent of the package.

In this configuration, the package containing an optical device is pressed toward the base under the force of the package securing member, so as to be secured to the base. The package securing member is independent of the package. In other words, the package has no package securing member arranged so as to project from the front end face along the attachment surface. Therefore, the package is free of the package securing member at the time of assembling the package, whereby the assembling workability in connecting an optical fiber to the package and so forth can be inhibited from lowering.

The pressing part may be positioned at an end of the first package securing member in a side facing the package, while the first extension may be provided between the attachment surface and the pressing part. In this configuration, the first extension of the package is held between the attachment surface and pressing part, so as to be pressed by the pressing part toward the attachment surface. Hence the package can be secured surely to the base.

The package may have a second extension forming a second side of the bottom wall extending from a second side wall of the package, the second side fall being opposite to the first side wall, the apparatus further comprising a second package securing member having a pressing part abutting against the second extension to press the package against the base. In this configuration, the apparatus has a structure for securing the package on the second side wall side as well. Therefore, the package can be secured more surely to the base.

The package may have a third extension forming a third side of the bottom wall extending from a third side wall orthogonal to the first side wall and the attachment surface, the apparatus further comprising a third package securing member having a pressing part abutting against the third extension to press the package against the base. In this configuration, the apparatus has a structure for securing the package on the third side wall side as well. Consequently, the package can be secured more surely to the base.

At least one of the second and third package securing members may be independent of the base. In this configuration, the package securing member is a component independent of the base and package. Hence the forms of the base, package, and package securing member can be simplified, whereby the optical apparatus can be manufactured easily.

The package securing member and base may be integrated with each other. This configuration makes it unnecessary for the package securing member to be attached to the base. Therefore, the process of assembling the optical apparatus can be simplified.

The first package securing member may be fixed to the base.

The first package securing member may be a part of the base.

The apparatus in accordance with another embodiment of the present invention comprises a package configured to contain a device, a base having an attachment surface, a package configured to enclose a device and provided on the attachment surface of the base, the package having a first side wall, a second side wall opposite to the first side wall, and an upper face extending substantially in parallel to the attachment surface of the base, and a package securing member having a first and second flanges, and a pressing part connecting the first flange with the second flange, the pressing part abutting against the upper face of the package to press the package toward the base, the first flange extending along the first surface of the package to the attachment surface, the second flange extending along the second surface of the package to the attachment surface, wherein the package securing member is independent of the package. In this configuration, the pressing part of the package securing member presses the upper face of the package, which makes it unnecessary to form an extension part projecting from the package along the attachment surface. Hence the form of the package can be simplified.

The apparatus in accordance with still another embodiment of the present invention comprises a base having an attachment surface, a package configured to enclose a device, the package having a first side wall, a second side wall opposite to the first side wall, and an bottom wall connecting the first side wall with the second side wall, the bottom wall being in contact with the attachment surface, a first extension constituting a first side of the bottom wall, the first side extending from the first side wall outwardly, and abutting against a first package securing member independent of the package, and wherein the bottom wall provides a second package securing member in an end of the second side wall, the second package securing member having a through hole through which the bottom wall is fastened to the base.

The first securing member may be a part of the attachment surface of the base.

Details of Embodiments of the Present Invention

First Embodiment

In the following, specific examples of the optical apparatus in accordance with the present invention will be explained with reference to the drawings. The present invention is not limited to these illustrations but indicated by the claims and intends to include all the changes within the spirit and scope equivalent to the claims. In the explanation of drawings, the same constituents will be referred to with the same signs while omitting their overlapping descriptions.

Figure 1B:
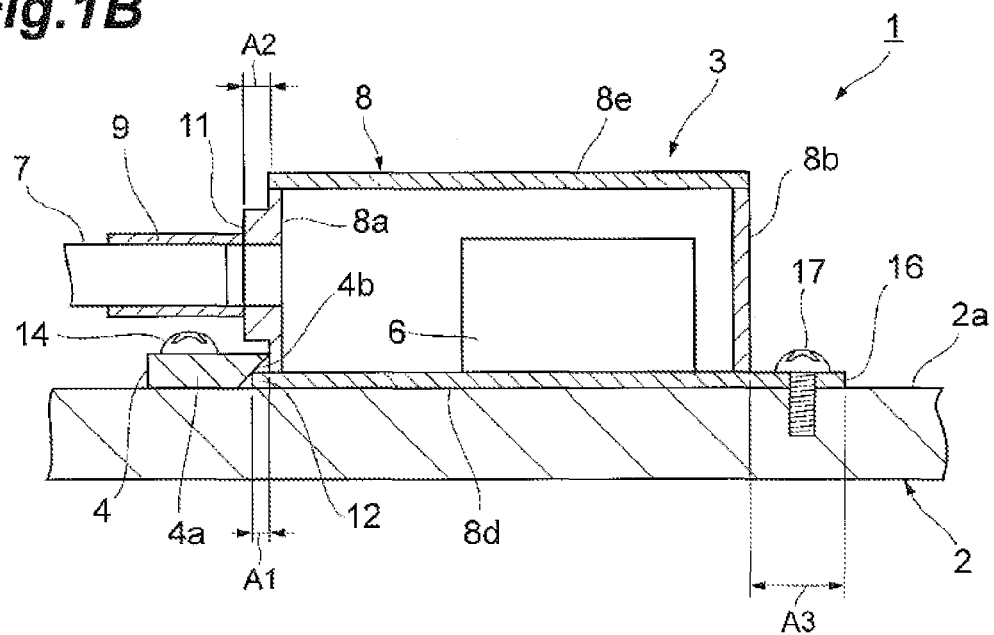

FIG. 1A is a plan view illustrating an optical apparatus 1 in accordance with an embodiment of the present invention. FIG. 1B is a sectional view of the optical apparatus 1 taken along the line I-I of FIG. 1A. As illustrated in FIGS. 1A and 1B, the optical apparatus 1 comprises a base 2, a package 3 attached to the base 2, and a package securing member 4 for securing the package 3 to the base 2. The base 2 is a box made of a metal and contains the package 3 and other optical components, electronic boards, and the like which are not depicted. The base 2 has a base. The base has a plurality of tapped holes for mechanically securing the package 3 and the like. The base 2 also has an attachment surface 2a. The attachment surface 2a abuts against the package 3 when the latter is attached.

The package 3 contains an optical device 6 such as a laser diode. The package 3 also optically connects the optical device 6 and an optical fiber 7 to each other by keeping a positional relationship between the optical device 6 and optical fiber 7. The package 3 is shaped into a box made of a metal such as an iron-nickel-cobalt alloy, for example. More specifically, the package 3 has a package body 8. Welded to the package body 8 is a connection sleeve 9 for attaching the optical fiber 7 to the package body 8. The package body 8 has a front end face (first side wall) 8a and a rear end face (second side wall) 8b. The optical fiber 7 is attached to the front end face 8a. The rear end face 8b pairs with the front end face 8a. The package body 8 further has a pair of side faces 8c, a back face (bottom wall) 8d, and an upper face 8e. The pair of side faces 8c connects the front end face 8a and rear end face 8b to each other. The back face 8d abuts against the attachment surface 2a of the base 2. The upper face 8e pairs with the back face 8d. In the package 3, the distance (length) from the front end face 8a to the rear end face 8b is 20 mm, the distance (width) between the pair of side faces 8c is 10 mm, and the distance (height) from the rear face 8d to the upper face 8e is 8 mm, for example. The pair of side faces 8c are also provided with a plurality of leads 10 which are electrically connected to the optical device 6. The leads 10 are mechanically connected to the package body 8 through feedthroughs which are not depicted.

The front end face 8a is formed with a through window part 11 for attaching the optical fiber 7 thereto. The optical fiber 7 is mechanically secured to the package 3 through a connection sleeve 9 attached to the through window part 11. The connection sleeve 9 is made of a metal such as an iron-chromium-nickel alloy, for example, and laser-welded to the through window part 11. The first extension 12 projects from the front end face 8a along the attachment surface 2a. The first extension 12 is a part of the back face 8d in this embodiment. Its extension part length A1 from the front end face 8a is substantially equal to or shorter than the extension part length A2 of the through window part 11.

The package securing member 4 is attached onto the attachment surface 2a of the base 2. The package securing member 4 is a planar component and has a pair of tapped holes. The package securing member 4 is independent of the package 3 and base 2. The package securing member 4 has a first flange (first package securing member) 4a. The first flange 4a is arranged so as to project from the front end face 8a side along the attachment surface 2a. A tilted surface (pressing part) 4b is formed at an end of the package 3 in the first flange 4a and abuts against the first extension 12. In view of dimensional tolerances and securing strengths in components constituting the optical apparatus 1, the package securing member 4 may have a thickness greater than the board thickness of the first extension 12. In the package securing member 4, the part to abut against the first extension 12 may be the tilted surface 4b. The first extension 12 is arranged between the attachment surface 2a of the base 2 and the tilted surface 4b of the first flange 4a. Fastening screws 14 inserted into the tapped holes narrows the gap between the tilted surface 4b and attachment surface 2a. Therefore, the first extension 12 is held between the tilted surface 4b and attachment surface 2a.

A pair of rear end flanges 16 project from the rear end face 8b along the attachment surface 2a. The rear end flanges 16 are a part of the back face 8d in this embodiment. Their extension part length A3 from the rear end face 8b is longer than the extension part length A1 of the first extension 12. The rear end flanges 16 are formed with respective through holes for inserting screws 17 therethrough.

Figure 2:
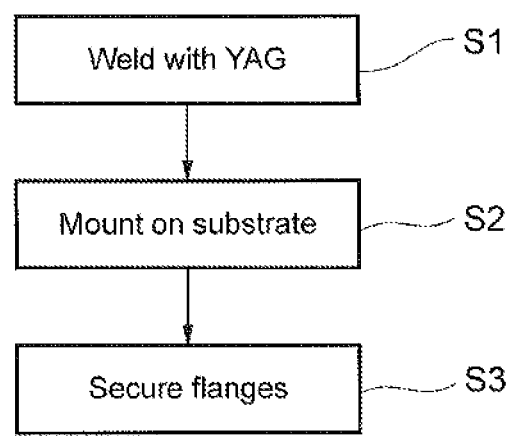
FIG. 2 is a flowchart illustrating main steps of assembling the optical apparatus.

Steps of assembling the optical apparatus 1 will now be explained with reference to FIGS. 2, 3A, 3B, and 3C. FIG. 2 is a flowchart illustrating main steps of assembling the optical apparatus 1. FIGS. 3A, 3B, and 3C are side views illustrating respective states of the steps represented in the flowchart of FIG. 2.

As illustrated in FIG. 3A, the connection sleeve 9 for inserting the optical fiber 7 is attached to the package body 8. Specifically, the connection sleeve 9 is brought into contact with the through window part 11 at first. Subsequently, an abutment part 11a between the through window part 11 and connection sleeve 9 is irradiated with a YAG laser Y (step S1). At this time, a laser device 18 is held at a fixed position. The connection sleeve 9 and package body 8 are rotated. The laser device 18 irradiates the circumferential abutment part 11a between the through window part 11 and connection sleeve 9 with the YAG laser Y. The laser irradiation may be either continuous or in spots. This step S1 completes the package 3.

Next, as illustrated in FIG. 3B, the package 3 is attached to the base 2. Specifically, the package 3 is mounted on the attachment surface 2a of the base 2 at first. Subsequently, alignment is performed (step S2). Then, the screws 17 are inserted into the tapped holes of the rear end flanges 16, so as to screw the rear end flanges 16 to the base 2. Subsequently, the package securing member 4 is arranged as illustrated in FIG. 3C. At this time, the tilted surface 4b of the package securing member 4 is brought into contact with the first extension 12. Thereafter, the screws 14 are inserted into the through holes of the package securing member 4, so as to screw the package securing member 4 to the base 2 (step S3). The optical apparatus 1 is completed through the foregoing steps S1 to S3.

Figure 11A:
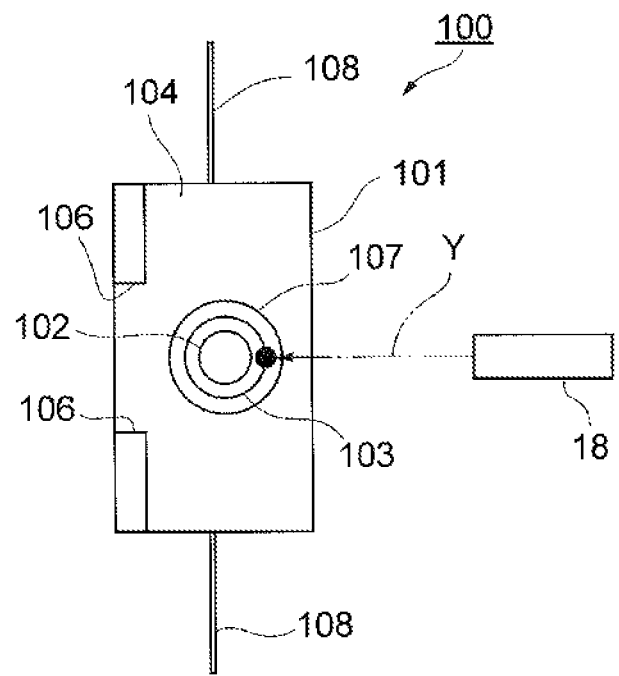
FIGS. 11A and 11B are diagrams illustrating respective states of steps of assembling an optical apparatus in accordance with a comparative example.
Figure 11B:
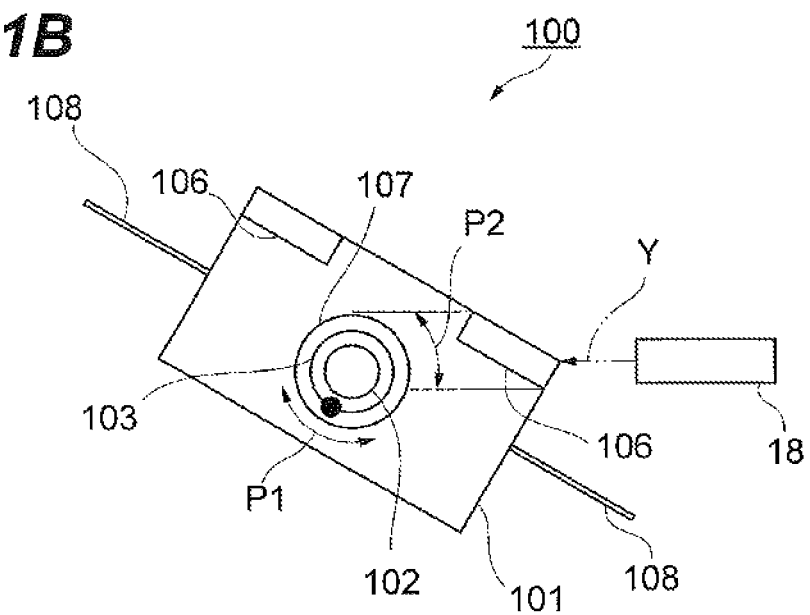

Steps of assembling an optical apparatus in accordance with a comparative example will now be explained. FIGS. 11A and 11B are diagrams illustrating respective states of the steps of assembling an optical apparatus 100 in accordance with the comparative example. As illustrated in FIG. 11A, a connection sleeve 103 holding an optical fiber 102 is welded to a package 101 in the optical apparatus 100 in accordance with the comparative example as well. This package 101 has two flanges 106. The flanges 106 are provided at a front end face 104 to which the connection sleeve 103 is attached. The flanges 106 are arranged so as to be kept from overlapping with leads 108. Therefore, the flanges 106 may obstruct YAG welding at the time of assembling external optical systems. For example, as illustrated in FIG. 11B, the package 101 is rotated in order to change the irradiation position of the YAG laser Y. This may place the flange 106 on an optical path of the YAG laser Y. Therefore, the optical apparatus 100 in accordance with the comparative example has a circumferential abutment part at which the connection sleeve 103 and a through window part 107 abut against each other. The abutment part of the optical apparatus 100 includes a region P1 which can be laser-welded and a region P2 which cannot be laser-welded.

In the optical apparatus 1, by contrast, the package 3 containing the optical device 6 is pressed toward the base 2 under the force of the package securing member 4, so as to be secured to the base 2. The package securing member 4 having the first flange 4a is independent of the package 3. In other words, the package 3 is free of the first flange 4a arranged so as to project from the front end face 8a along the attachment surface 2a. Since the package securing member 4 having the first flange 4a is provided as a component to be attached later, the package 3 is free of the first flange 4a at the time of its assembly. Therefore, the optical apparatus 1 can inhibit the assembling workability in connecting the optical fiber 7 to the package 3 and so forth from lowering.

For example, the package securing member 4, which may interfere with the YAG laser Y, is constructed so as to be separable from the package 3 in the optical apparatus 1. Therefore, as illustrated in FIG. 3A, there is no member blocking the YAG laser Y between the laser device 18 and abutment part 11a at the time of laser welding. Consequently, even when the connection sleeve 9 and package body 8 are rotated, the YAG laser Y is not blocked between the laser device 18 and abutment part 11a. This improves the degree of freedom in the welding operation, whereby the laser welding operation can be performed easily. Since the laser welding can be performed at desirable locations, the circumferential abutment part 11a where the connection sleeve 9 and through window part 11a but against each other can be welded at equally-spaced intervals. This can suppress tilts in the orientation of the connection sleeve 9 with respect to the package 3 which may be caused by internal stresses which may occur between the connection sleeve 9 and package 3 because of welding. Since welding at equally-spaced intervals is possible, the welding strength can be kept uniformly. These make it possible to respond flexibly to users' various demands for flange positions.

The package 3 has the first extension 12. The tilted surface 4b is formed at the end of the package securing member 4 on the package 3 side. The first extension 12 is held between the attachment surface 2a and tilted surface 4b. In this configuration, the first extension 12 of the package 3 is held between the attachment surface 2a and tilted surface 4b. Therefore, the first extension 12 is pressed toward the attachment surface 2a by the tilted surface 4b. Hence the package 3 can be secured surely to the base 2.

The package securing member 4 is independent of the base 2. In this configuration, the package securing member 4 is a member independent of the base 2 and package 3. Hence the forms of the base 2, package 3, and package securing member 4 can be simplified, whereby the optical apparatus 1 can be manufactured easily.

Second Embodiment

Figure 4A:
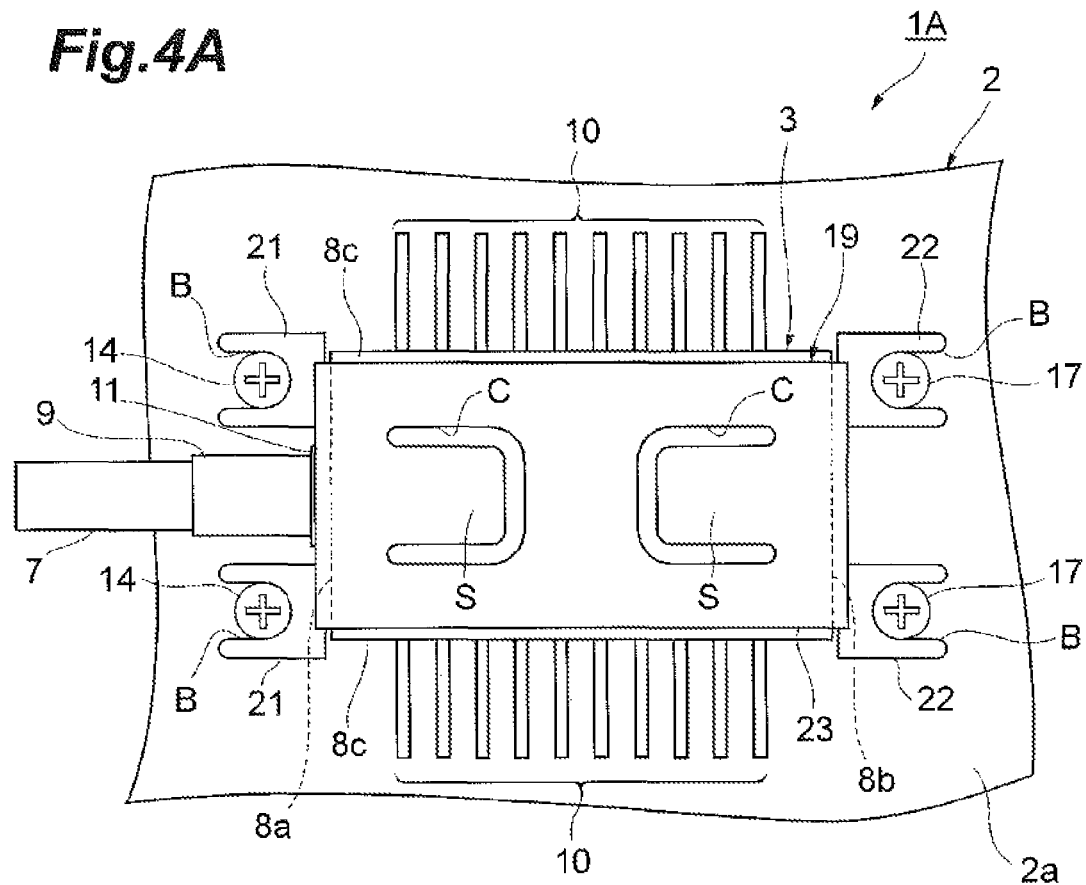
FIGS. 4A and 4B are diagrams illustrating an optical apparatus in accordance with a second embodiment.
Figure 4B:
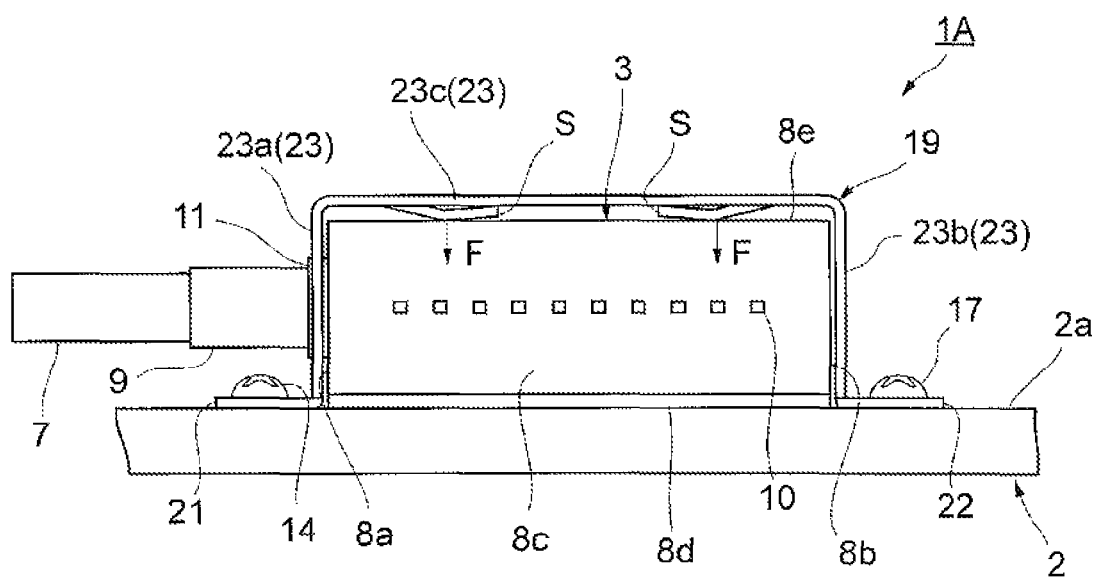

An optical apparatus 1A in accordance with a second embodiment now be explained. FIG. 4A is a plan view illustrating the optical apparatus 1A in accordance with the second embodiment. FIG. 4B is a side view of the optical apparatus 1A. The optical apparatus 1A differs from the optical apparatus 1 in accordance with the first embodiment in that it has a package securing member 19 arranged so as to cover the package 3. In the following, the package securing member 19 will be explained in detail.

The package securing member 19 covers the package 3 by extending from the front end face 8a through the upper face 8e to the rear end face 8b. The package securing member 19 has first flanges 21, second flanges 22, and a pressing part 23. The first flanges 21 are arranged so as to project from the front end face 8a side along the attachment surface 2a. The second flanges 22 are arranged so as to project from the rear end face 8b side along the attachment surface 2a. The pressing part 23 connects the first and second flanges 21, 22 to each other. The first and second flanges 21, 22 are arranged two each which are independent of each other in a direction in which a pair of side faces (third side walls) 8c oppose each other. Each of the first and second flanges 21, 22 is formed with a screw holder B having a U-shape in planar view.

As illustrated in FIG. 4B, the pressing part 23 has a U-shaped cross section in lateral view. The pressing part 23 has a front face part 23a, a rear face part 23b, and an upper face part 23c. The front face part 23a extends from the ends on the package 3 side of the first flanges 21 to the upper face 8e side. The rear face part 23b extends from the ends on the package 3 side of the second flanges 22 to the upper face 8e side. The upper face part 23c extends over the upper face 8e so as connect the front and rear face parts 23a, 23b to each other.

Grooves C (see FIG. 4A) are formed in the upper face part 23c. The grooves C turn a portion of the upper face part 23 into cantilever spring parts S. The spring parts S are bent slightly toward the package 3. More specifically, in a state where the package securing member 19 is not attached to the base 2, the distance along the height direction between the spring parts S and the first and second flanges 21, 22 is slightly smaller than the height of the package 3. When the package securing member 19 is attached to the base 2, the spring parts S are pressed by the upper face 8e of the package 3, so as to deform. This deformation generates a force F to press the package 3 toward the base 2 in the spring parts S. Hence the package 3 can be secured surely to the base 2.

Figure 5:
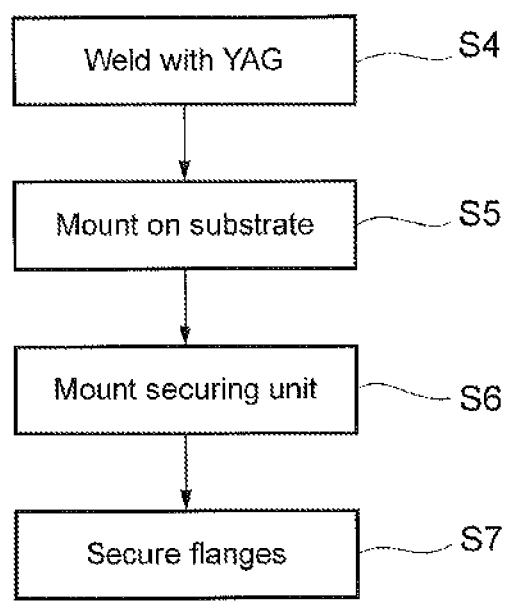
FIG. 5 is a flowchart illustrating main steps of assembling the optical apparatus.

Steps of assembling the optical apparatus 1A will now be explained with reference to FIGS. 5, 6A, 6B, 6C, and 6D. FIG. 5 is a flowchart illustrating main steps of assembling the optical apparatus 1A. FIGS. 6A, 6B, 6C, and 6D are side views illustrating respective states of the steps represented in the flowchart of FIG. 5.

Figure 6A:
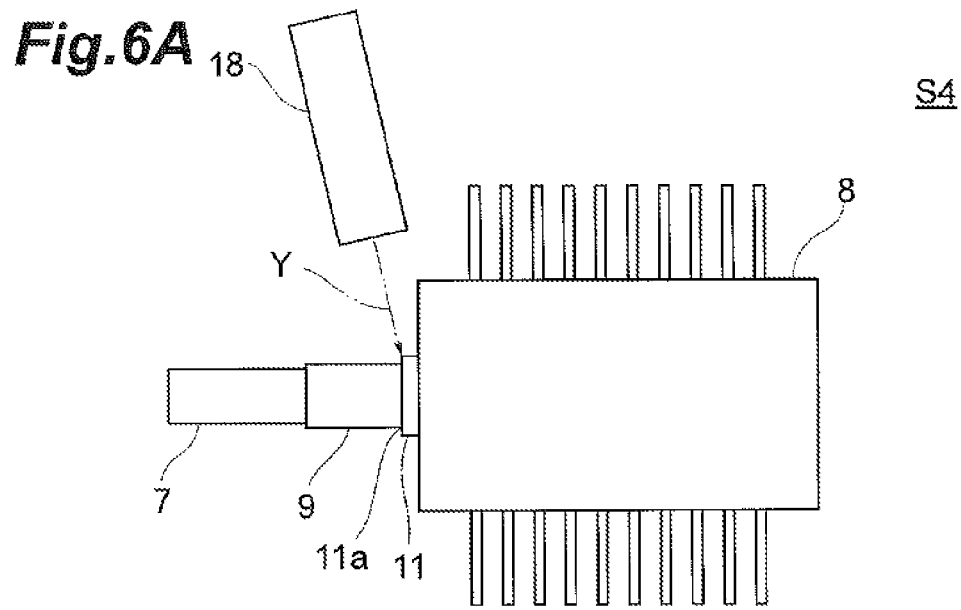
FIGS. 6A, 6B, 6C, and 6D are side views illustrating respective states of the steps illustrated in the flowchart of FIG. 5.

As illustrated in FIG. 6A, the connection sleeve 9 for inserting the optical fiber 7 is attached to the package body 8. Specifically, the connection sleeve 9 is brought into contact with the through window part 11 at first. Subsequently, the abutment part 11a between the through window part 11 and connection sleeve 9 is irradiated with the YAG laser Y (step S4). At this time, the laser device 18 is held at a fixed position. The connection sleeve 9 and package body 8 are rotated. The laser device 18 irradiates the circumferential abutment part 11a between the through window part 11 and connection sleeve 9 with the YAG laser. The laser irradiation may be either continuous or in spots. This step S4 completes the package 3.

Figure 6B:
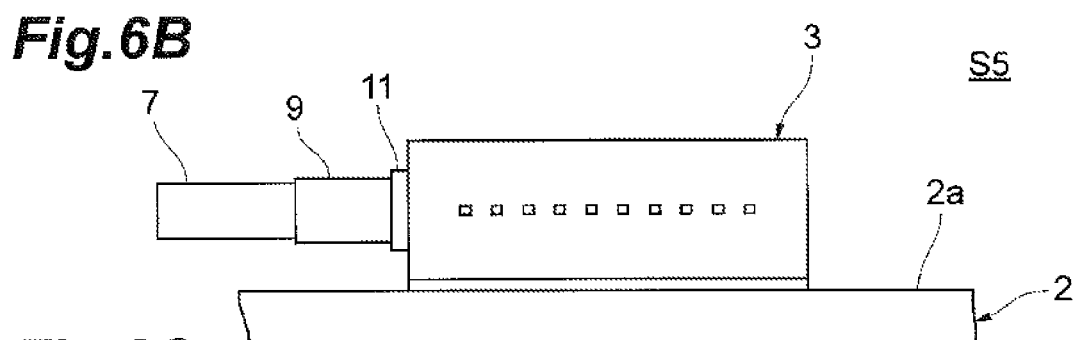
Figure 6C:
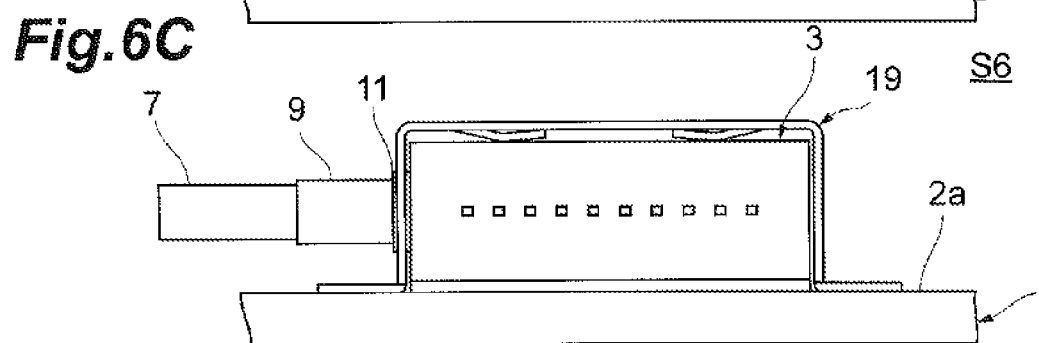
Figure 6D:
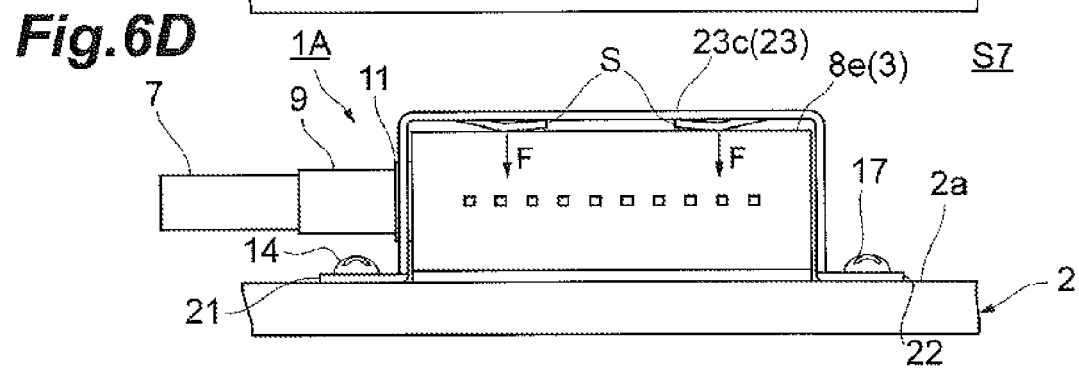

Next, as illustrated in FIG. 6B, the package 3 is attached to the base 2. Specifically, the package 3 is mounted on the attachment surface 2a of the base 2 at first. Subsequently, alignment is performed (step S5). Then, as illustrated in FIG. 6C, the package securing member 19 is attached so as to cover the package 3 (step S6). Thereafter, as illustrated in FIG. 6D, the first flanges 21 are secured to the base 2 with the screws 14. The second flanges 22 are also secured to the base 2 with the screws 17 (step S7). At this time, fastening the screws 14, 17 narrows the gap between the upper face part 23c and the upper face 8e of the package 3, thereby deforming the leaf springs S. The deformation of the leaf springs S generates the force F to press the package 3 toward the attachment surface 2a of the base 2. The pressing force F secures the package 3 to the base 2. The optical apparatus 1A is completed through the foregoing steps S4 to S7.

The package 3 is free of flanges which may lower the assembling workability in the optical apparatus 1A in accordance with this embodiment as in the optical apparatus 1 in accordance with the first embodiment. This makes it possible to respond flexibly to users' various demands for flange positions. Therefore, effects similar to those of the optical apparatus 1 in accordance with the first embodiment can be obtained.

In the optical apparatus 1A, the pressing part 23 of the package securing member 19 presses the upper face 8e of the package 3, which makes it unnecessary to form a extension part projecting from the package 3 along the attachment surface 2a. This can simplify the form of the package 3.

The present invention is not limited to the above-mentioned embodiments, but can be modified in various ways within the scope not departing from the gist of the present invention.

Modified Example 1

Figure 7A:
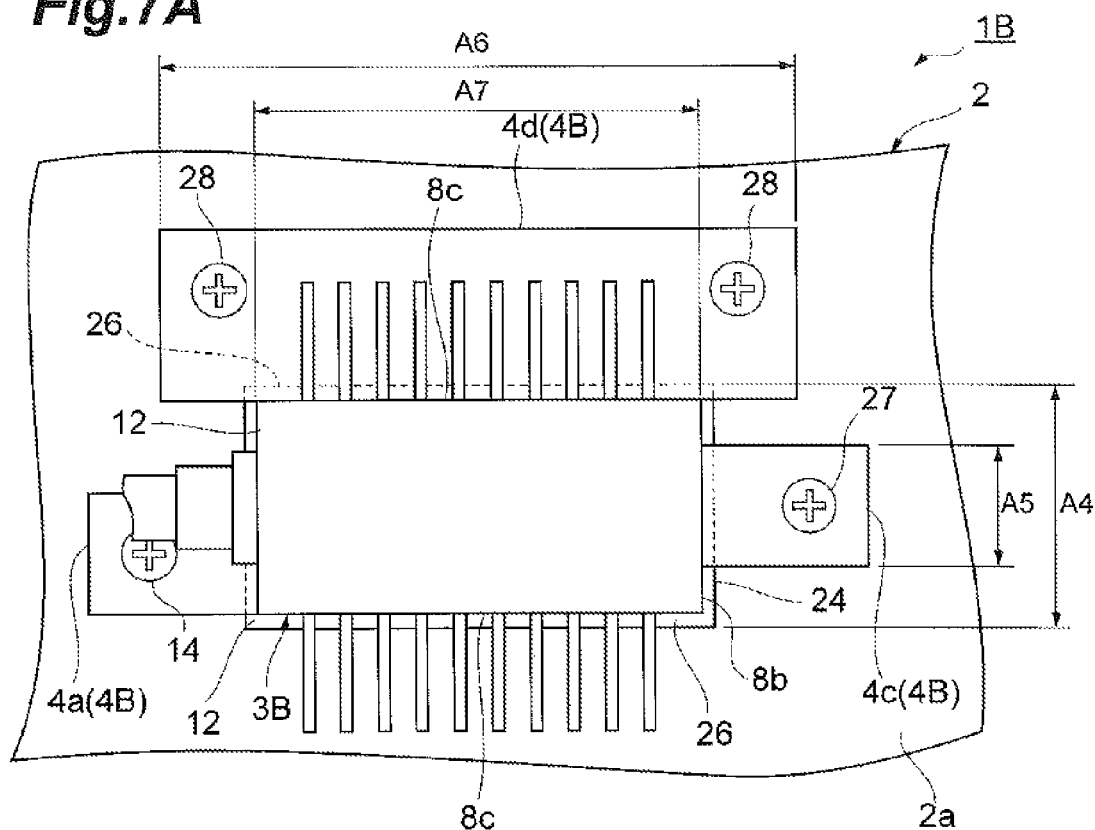
FIGS. 7A and 7B are diagrams illustrating an optical apparatus in accordance with Modified Example 1.
Figure 7B:
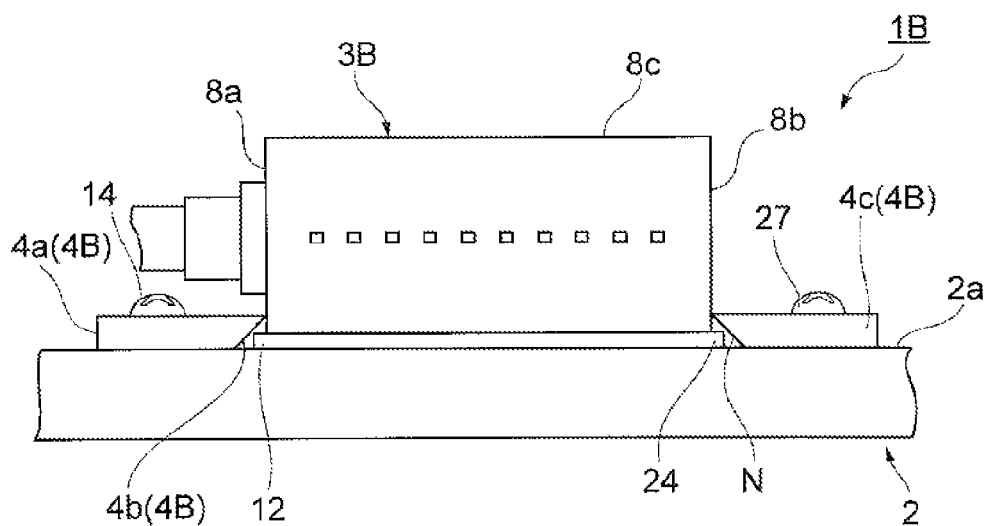

FIG. 7A is a diagram illustrating an optical apparatus 1B in accordance with Modified Example 1. FIG. 7B is a side view of the optical apparatus 1B. In the optical apparatus 1B, as illustrated in FIGS. 7A and 7B, its package 3B may have second and third extensions 24, 26 in addition to the first extension 12. Its package securing member 4B may have a second flange (second package securing member) 4c and a third flange (third package securing member) 4d in addition to the first flange 4a and tilted surface 4b. The second flange 4c is secured to the base 2 with a screw 27. The third flange 4d is secured to the base 2 with screws 28. The second extension 24 projects from the rear end face 8b side of the package 3 along the attachment surface 2a. The third extension 26 projects from the side face 8c side of the package 3 along the attachment surface 2a. Each of the second and third extensions 24, 26 has a extension part length equivalent to that of the first extension 12.

The second flange 4c is arranged on the second extension 24. The second extension 24 is held between a tilted surface N of the second flange 4c and the attachment surface 2a. The second flange 4c has a length A5 shorter than the distance A4 between a pair of side faces 8c. The second flange 4c covers a part of the second extension 24. The third flange 4d is arranged on the third extension 26. The third extension 26 is held between a tilted surface (not depicted) of the third flange 4d and the attachment surface 2a. The third flange 4d has a longitudinal length A6 greater than the length A7 from the front end face 8a to the rear end face 8b. The third flange 4d covers the third extension 26 as a whole.

Thus, forming a plurality of extension parts can improve selectivity in flange arrangement. That is, it can respond flexibly to users' various demands for flange positions. The first and second flanges 4a, 4c are arranged so as to cover the first and second extensions 12, 24 partly. This arrangement improves the degree of freedom in positions for arranging flanges. Therefore, the first and second flanges 4a, 4c can be arranged so as to keep away from parts protruding from the package 3, thereby making it possible to improve the workability at the time of attaching the package 3 to the base 2. The third flange 4d is arranged so as to cover the third extension 26 as a whole. This configuration enables the third flange 4d to hold the third extension 26 securely.

Modified Example 2

FIGS. 8A, 8B, 9A, and 9B are diagrams illustrating an optical apparatus in accordance with Modified Example 2.

Figure 8A:
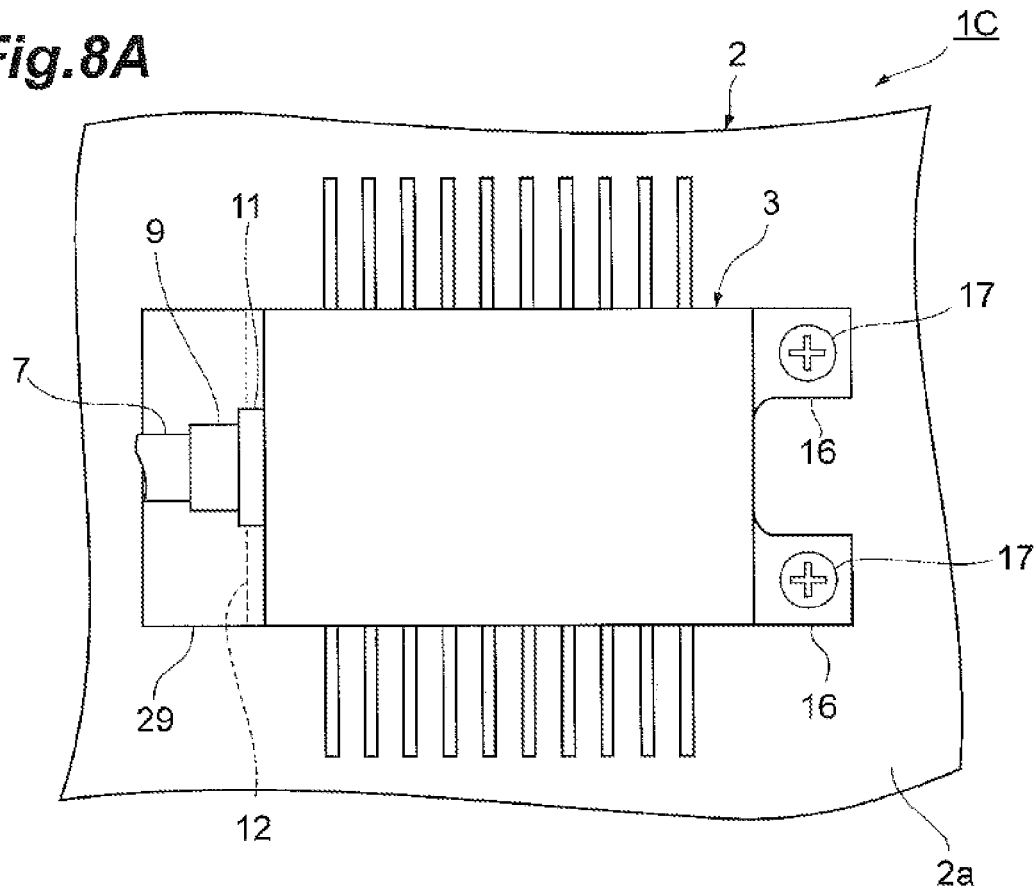
FIGS. 8A and 8B are diagrams illustrating an optical apparatus in accordance with Modified Example 2.
Figure 8B:
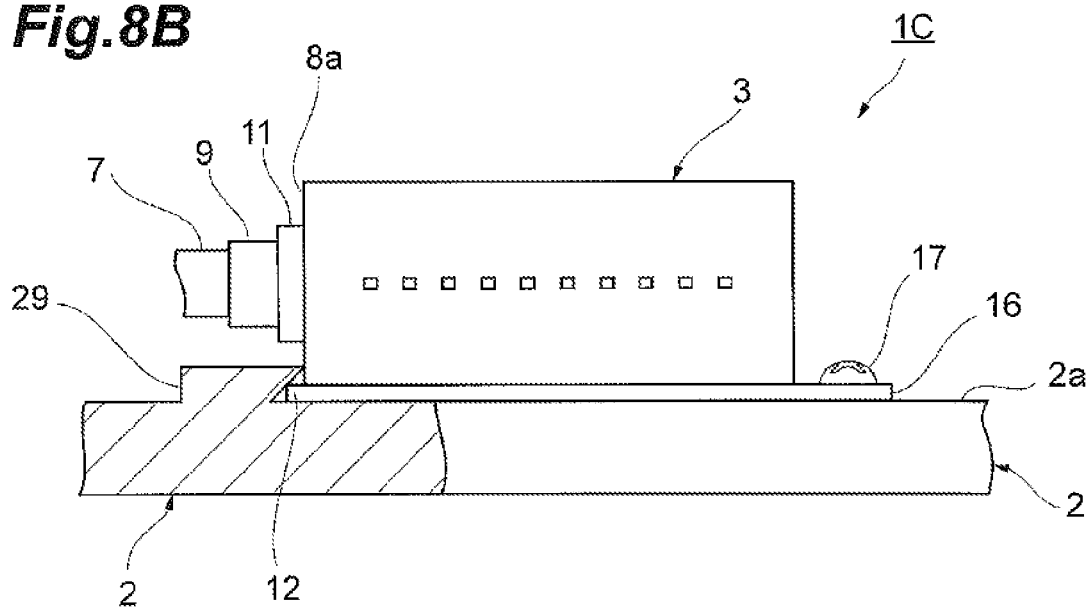

As illustrated in FIGS. 8A and 8B, an optical apparatus 1C may comprise a first flange 29 integrated with the base 2. The first flange 29 holds the first extension 12 formed at the front end face 8a. The first flange 29 constitutes a part of the base 2 and is in the form of a hook. When attaching the package 3, the first extension 12 of the package 3 is arranged so as to be caught by the first flange 29. Then, the rear end flanges 16 are screwed to the base 2. As illustrated in FIGS. 9A and 9B, an optical apparatus 1D may comprise a second flange 31 integrated with the base 2. The second flange 31 holds the second extension 24 formed at the rear end face 8b. The second flange 31 constitutes a part of the base 2 and is in the form of a hook. In this case, the second extension 24 of the package 3 is arranged so as to be caught by the second flange 31. Then, the first flange 4a is screwed to the base 2. Such a configuration can secure the package 3 to the base 2 even at locations where flanges are hard to place. This makes it possible to respond flexibly to users' various demands for flange positions.

Modified Example 3

Figure 10A:
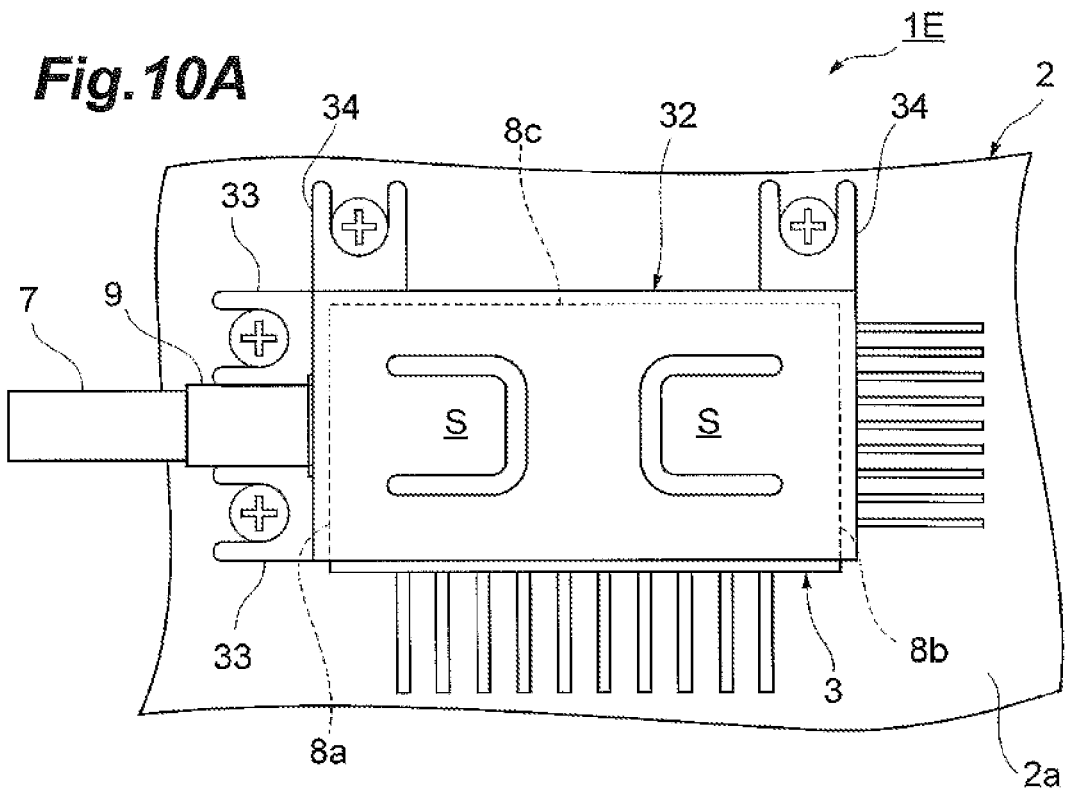
FIGS. 10A and 10B are diagrams illustrating optical apparatus in accordance with Modified Example 3.
Figure 10B:
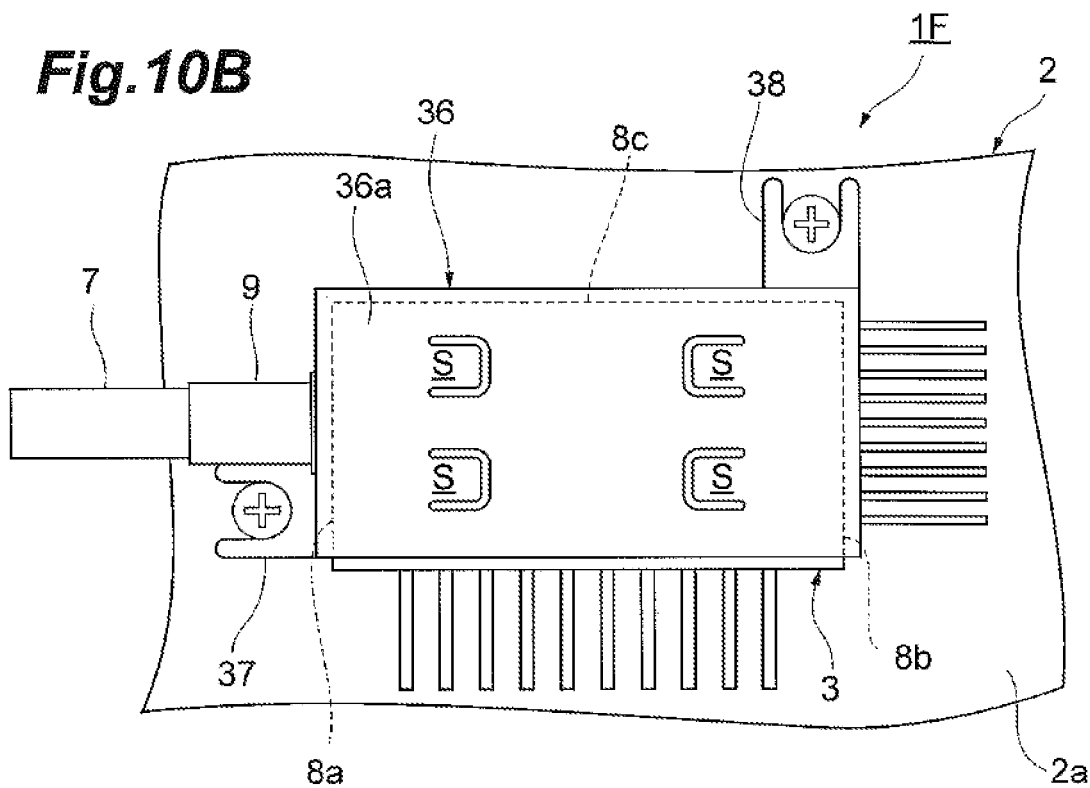

FIGS. 10A and 10B are diagrams illustrating optical devices 1E, 1F in accordance with Modified Example 3. As illustrated in FIG. 10A, flanges 33, 34 are provided in a package securing member 32. As illustrated in FIG. 10B, flanges 37, 38 are provided in a package securing member 36. The flanges 33, 34, 37, 38 may have desirable positions and numbers according to the form of the package 3 and the like. For example, as illustrated in FIG. 10A, the package securing member 32 of the optical apparatus 1E has one pair each of flanges 33, 34. The pair of flanges 33 are disposed so as to project from the front end face 8a side of the package 3 along the attachment surface 2a. The pair of flanges 34 are disposed so as to project from the side face 8c side of the package 3 along the attachment surface 2a. As illustrated in FIG. 10B, the package securing member 36 of the optical apparatus 1F has one each of flanges 37, 38. The flange 37 is disposed so as to project from the front end face 8a side of the package 3 along the attachment surface 2a. The flange 38 is disposed so as to project from the side end face 8c side of the package 3 along the attachment surface 2a. Spring parts S formed in a pressing part 36a of the package securing member 36 may have a desirable number according to the weight, form, or holdability (securing strength) of the package 3. For example, two or more spring parts S or just one spring part S may be formed. This makes it possible to respond flexibly to users' various demands for flange positions.

What is claimed is:

1. An apparatus comprising:
    a package configured to enclose a device, the package having a first side wall and a bottom wall, the first side wall including a window part for attaching an optical fiber or a receptacle to the first side wall of the package, the window part extending from the first side wall of the package outwardly by a first distance;
    a base having an attachment surface to which the bottom wall of the package is attached;
    a first extension forming a first side of the bottom wall, the bottom wall extending from the first side wall of the package outwardly by a second distance, the second distance being less than or equal to the first distance; and
    a first package securing member having a pressing part abutting against the first extension to press the package against the base;
    wherein the first package securing member is independent of the package and extends outwardly to a third distance relative to the first side wall of the package, the third distance being equal to or greater than the first distance, and
    wherein the first extension is integral with the bottom wall, and is a part of the package.

2. The apparatus according to claim 1, wherein the pressing part is positioned at an end of the first package securing member in a side facing the package; and
    wherein the first extension is provided between the attachment surface and the pressing part.

3. The apparatus according to claim 1, wherein the package has a second extension forming a second side of the bottom wall extending from a second side wall of the package, the second side wall being opposite to the first side wall;
    the apparatus further comprising a second package securing member having a pressing part abutting against the second extension to press the package against the base.

4. The apparatus according to claim 3, wherein the package has a third extension forming a third side of the bottom wall extending from a third side wall orthogonal to the first side wall and the attachment surface;
    the apparatus further comprising a third package securing member having a pressing part abutting against the third extension to press the package against the base.

5. The apparatus according to claim 4, wherein at least one of the second and third package securing members is independent of the base.

6. The apparatus according to claim 1, wherein the first package securing member is fixed to the base.

7. The apparatus according to claim 1, wherein the first package securing member is a part of the base.

8. An apparatus comprising:
    a base having an attachment surface;
    a package configured to enclose a device, the package having a first side wall, a second side wall opposite to the first side wall, and a bottom wall connecting the first side wall with the second side wall, the bottom wall being in contact with the attachment surface, the first side wall including a window part for attaching an optical fiber or a receptacle to the first side wall of the package, the window part extending from the first side wall of the package outwardly by a first distance; and
    a first extension constituting a first side of the bottom wall, the bottom wall extending from the first side wall outwardly by a second distance, and abutting against a first package securing member independent of the package, the second distance being less than or equal to the first distance; and
    wherein the first package securing member extends outwardly to a third distance relative to the first side wall of the package, the third distance being equal to or greater than the first distance,
    wherein the bottom wall provides a second package securing member in an end of the second side wall, the second package securing member having a through hole through which the bottom wall is fastened to the base, and
    wherein the first extension is integral with the bottom wall, and is a part of the package.

9. The apparatus according to claim 8, wherein the first package securing member is a part of the attachment surface of the base.

10. An apparatus comprising:

a base having an attachment surface;

a package configured to enclose a device, the package having a first side wall, a second side wall opposite to the first side wall, and a bottom wall connecting the first side wall with the second side wall, the bottom wall being in contact with the attachment surface, the first side wall including a window part for attaching an optical fiber or a receptacle to the first side wall of the package, the second side wall including a plurality of leads attached to the second side wall of the package, the plurality of leads extending from the second side wall of the package outwardly by a first distance; and a first extension constituting a second side of the bottom wall, the bottom wall extending from the second side wall outwardly by a second distance, and abutting against a first package securing member independent of the package, the second distance being less than or equal to the first distance, wherein the bottom wall provides a second package securing member in an end of the first side wall, the second package securing member having a through hole through which the bottom wall is fastened to the base, wherein the first package securing member extends outwardly to a third distance relative to the second side wall of the package, the third distance being equal to or greater than the first distance, wherein the first extension is integral with the bottom wall and is a part of the package, and wherein the first package securing member is integral with the base, and is part of the base.

11. The apparatus according to claim 1, wherein a fastening screw fixes the first package securing member and the base.

12. The apparatus according to claim 8, wherein the first package securing member is integral with the base, and is part of the base.

13. The apparatus according to claim 10, wherein the first package securing member is integral with the base, and is part of the base.

* * * * *